United States Patent [19]

Gudger

[11] Patent Number: 4,894,563
[45] Date of Patent: Jan. 16, 1990

[54] OUTPUT MACROCELL FOR PROGRAMMABLE LOGIC DEVICE

[75] Inventor: Keith H. Gudger, Sunnyvale, Calif.

[73] Assignee: Atmel Corporation, San Jose, Calif.

[21] Appl. No.: 256,915

[22] Filed: Oct. 11, 1988

[51] Int. Cl.[4] .............................. H03K 19/177
[52] U.S. Cl. .................................. 307/465; 307/468
[58] Field of Search ............... 307/465, 468–469, 307/475, 481, 263, 272.2; 364/716

[56] References Cited

U.S. PATENT DOCUMENTS

| | | | |
|---|---|---|---|
| 3,566,153 | 2/1971 | Spencer Jr. | 307/205 |
| 3,816,725 | 6/1974 | Greer | 235/152 |
| 3,818,452 | 6/1974 | Greer | 340/166 |
| 4,124,899 | 11/1978 | Birkner et al. | 364/716 |
| 4,422,072 | 12/1983 | Cavlan | 340/825.87 |
| 4,644,192 | 2/1987 | Fisher | 307/465 |
| 4,684,830 | 8/1987 | Tsui et al. | 307/465 |
| 4,717,912 | 1/1988 | Harvey et al. | 340/825.83 |
| 4,742,252 | 5/1988 | Agrawal | 307/465 |
| 4,758,746 | 7/1988 | Birkner et al. | 307/465 |
| 4,758,747 | 7/1988 | Young et al. | 307/465 |
| 4,771,285 | 9/1988 | Agrawal et al. | 340/825.83 |

FOREIGN PATENT DOCUMENTS 177280 4/1986 European Pat. Off. .

OTHER PUBLICATIONS

Logic Diagrams for Monolithic Memories 32VX10, 20RA10 and 20RS10 Logic Devices.

Primary Examiner—David Hudspeth
Attorney, Agent, or Firm—Thomas Schneck

[57] ABSTRACT

A programmable logic device having an AND array receiving inputs and having programmable product term lines output to an OR array, and an output macrocell associated with each of a plurality of input/output pins. Each macrocell has a plurality of sum term lines from the OR array which may selectively be combined or left distinct, and a plurality of flip-flop registers receiving input from the combined or distinct sum lines. Each flip-flop has product term programmable clock, reset and preset lines and a dedicated feedback line into the AND array. A selection circuit is provided for selecting combinatorial output from one or more sum term lines or registered output from one of the flip-flop registers. A product term programmable output enable selects either the output or disables the output buffer so that a pin may receive input signals fed through a dedicated line into the AND array.

15 Claims, 4 Drawing Sheets

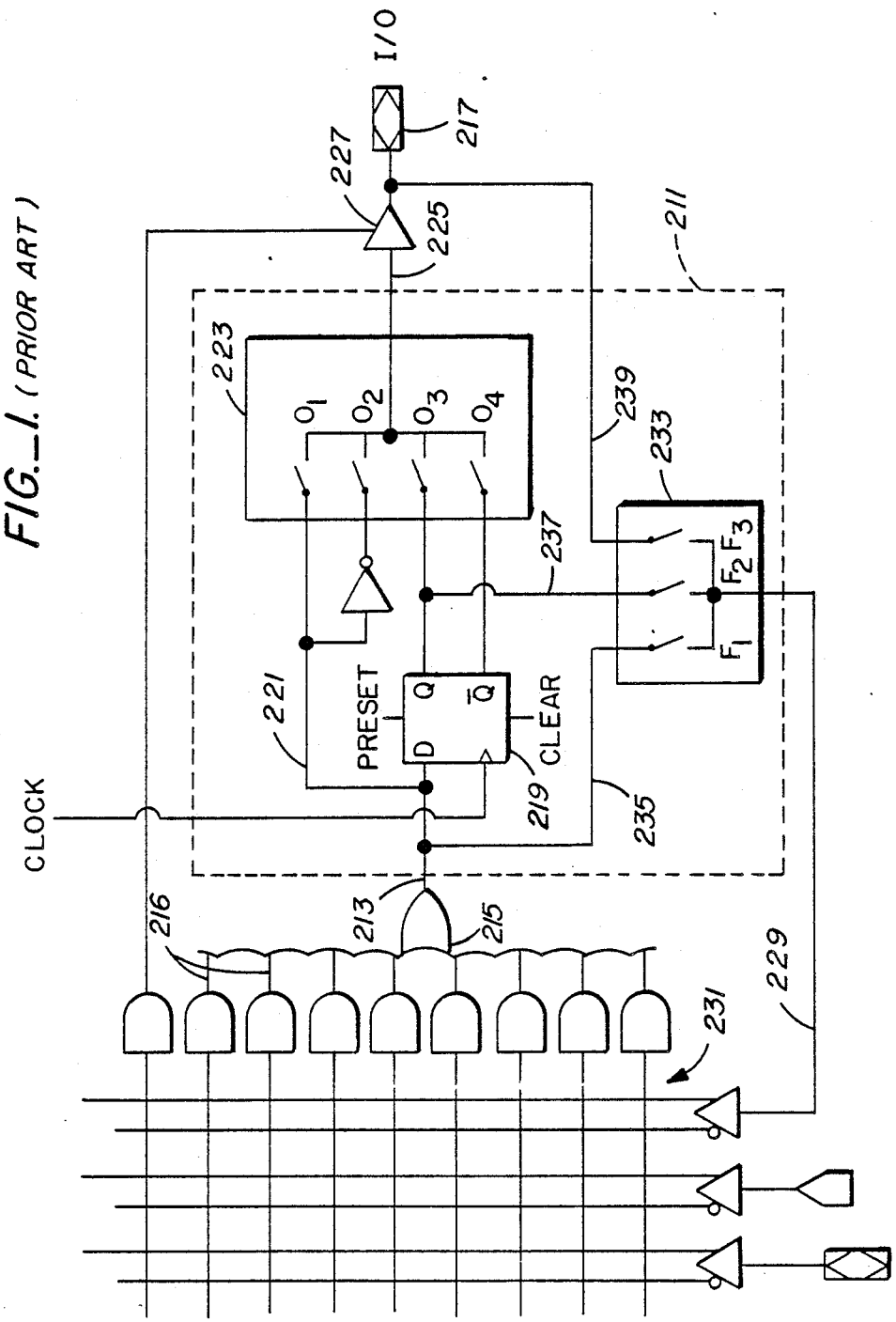
FIG._1. (PRIOR ART)

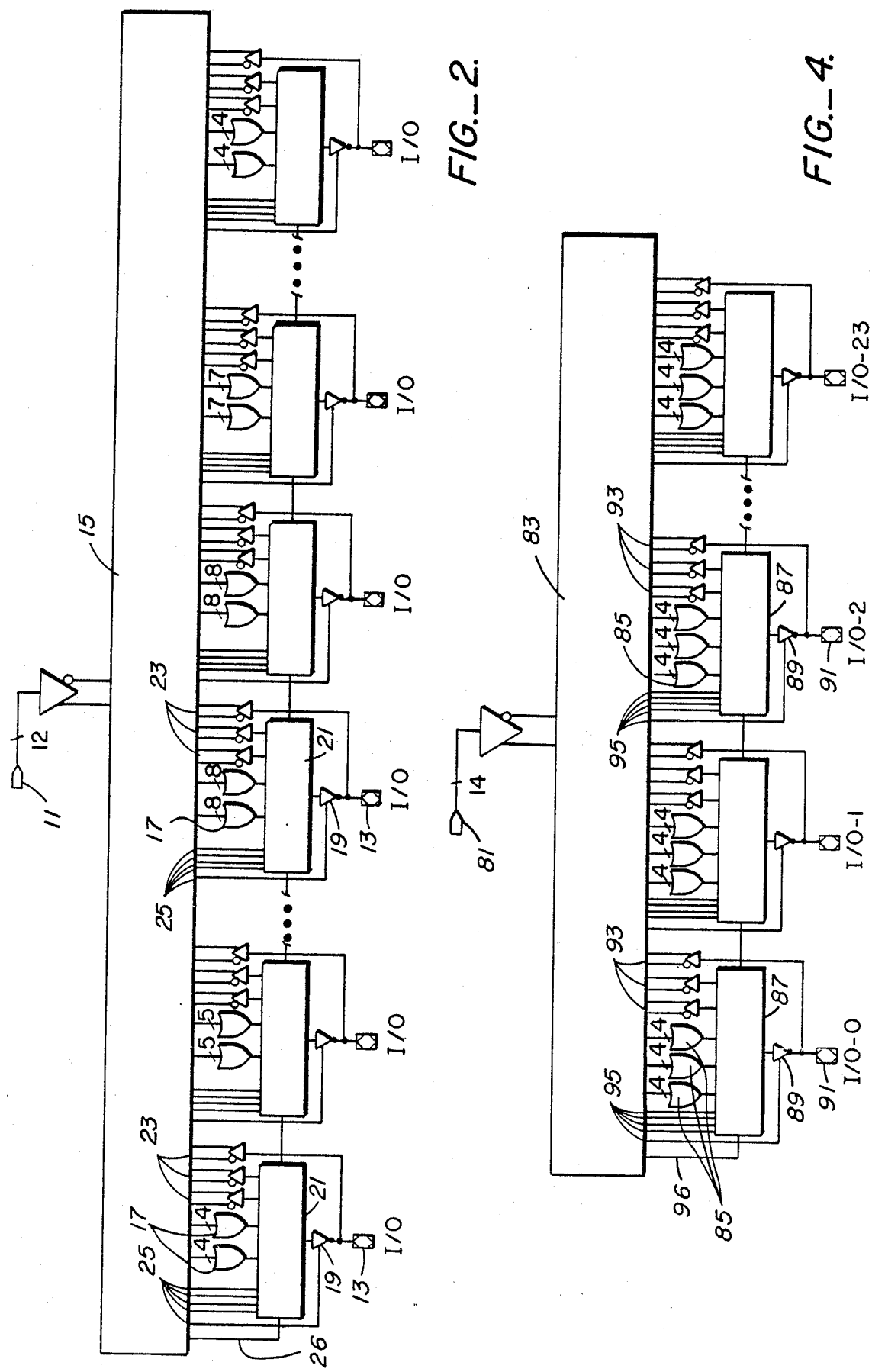

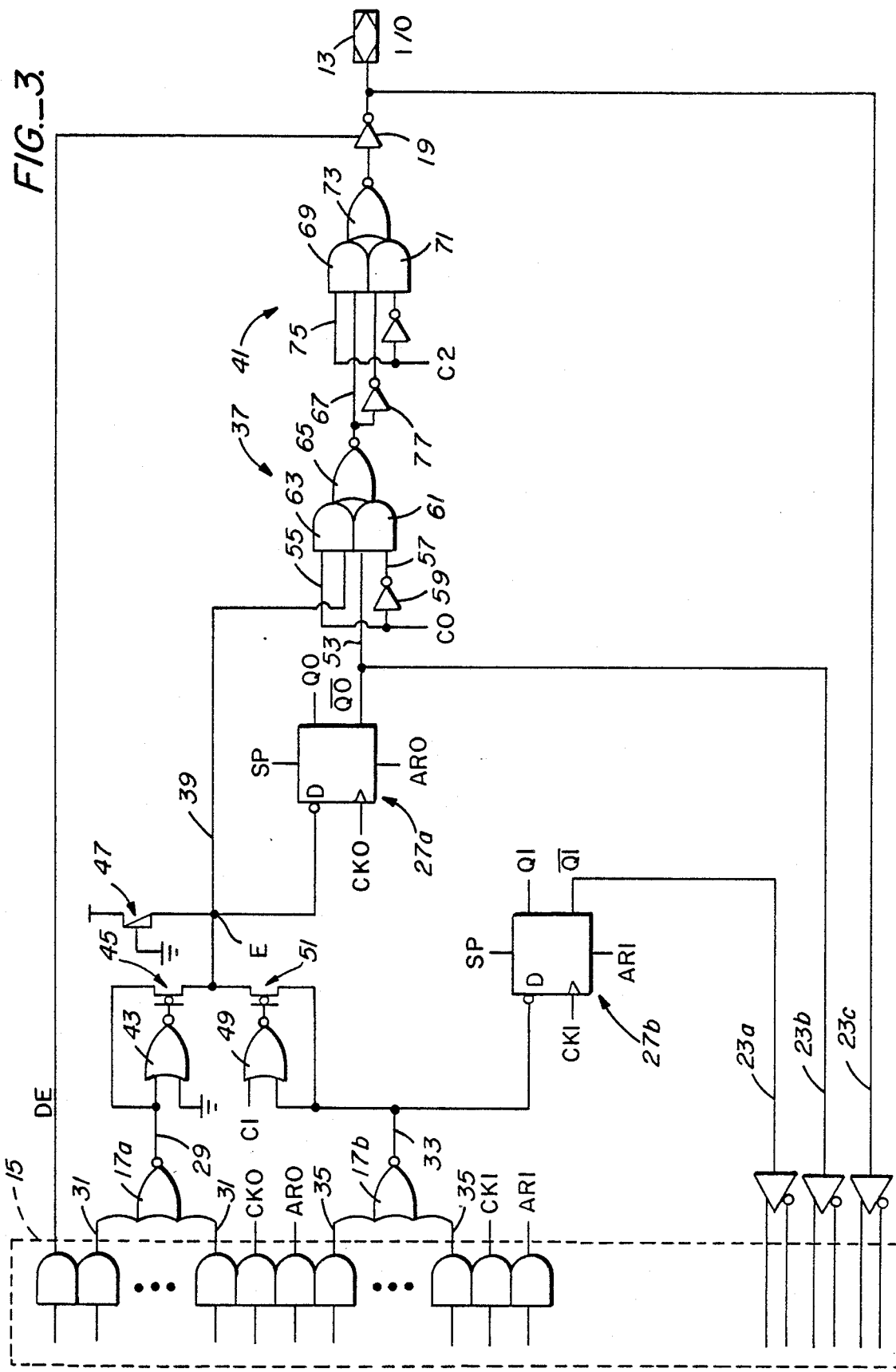
FIG._3

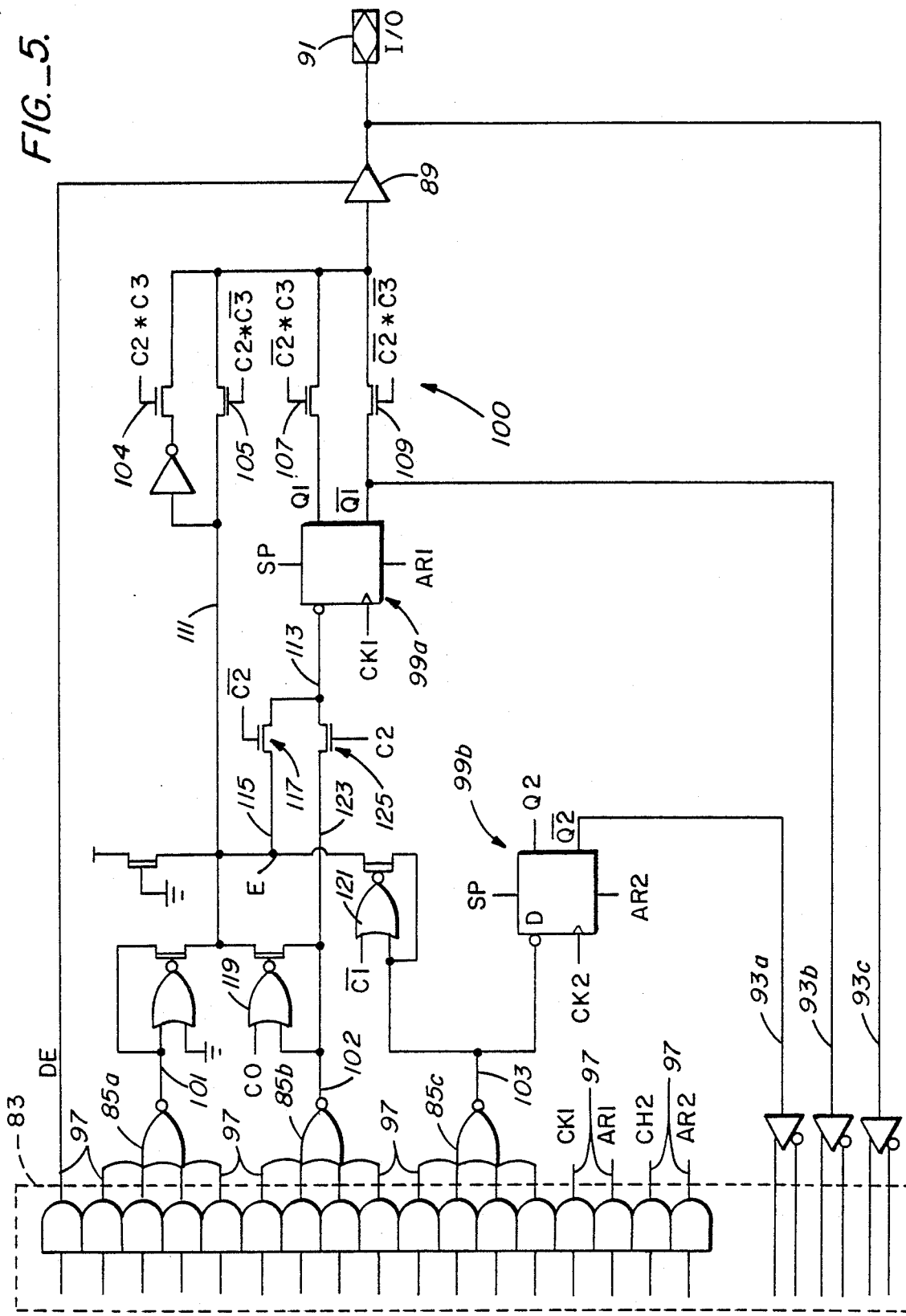
FIG._5.

4,894,563

OUTPUT MACROCELL FOR PROGRAMMABLE LOGIC DEVICE

TECHNICAL FIELD

The present invention relates to integrated circuits of the type called programmable logic devices, and in particular to output macrocells for programmable logic devices.

BACKGROUND ART

Logic functions are often implemented using a type of integrated circuit known as programmable logic devices (PLDs). These devices can be viewed as logic "templates" which can be easily configured by the manufacturer or consumer to provide custom logic functions not normally offered by IC manufacturers. PLDs typically include a programmable AND (or NAND or OR or NOR) gate array followed by either a programmable or fixed OR (or NOR or XOR) gate array which can be configured to provide a large variety of combinatorial logic functions. Any of several types of flip-flop registers are usually provided on at least some OR array output lines, called sum lines, with feedback lines back into the first array for performing sequential or state machine logic functions.

Among the other integrated logic components on the PLD chip is an architectural feature known as an "output macrocell". An output macrocell is generally defined as a collection of logic elements grouped together and usually associated with an input/output pin whose function is to transfer logic signals from the chip via that pin to other electrical components outside of the chip. One disadvantage of currently available PLDs is that in order to increase performance, some flexibility is sacrificed. Typically, this is done by fixing the number of options available to the user in the output macrocell. On the other hand, efforts to increase flexibility with the addition of optional features have previously sacrificed the high performance of simpler, but less flexible, devices.

FIG. 1 shows one output macrocell 211 of the prior art. The macrocell 211 is connected to a sum line 213 output from an OR gate 215 and to an input/output pin 217. Eight product terms 216 are fixed into a hard-wired OR gate 215. A single flip-flop register 219 is available in the macrocell. Register 219 has clock, preset and clear lines which are each permanently fixed to one input pin or product term for the entire device. Sum line 213 feeds data signals into data input D of register 219, and register 219 stores then outputs the signals, and corresponding inverted signals, through register outputs Q and $\overline{Q}$ respectively. Sum line 213 also sends combinatorial logic signals from OR gate 215 along a conductor 221. An output select 223 has switching elements O1–O4 which select one of the four output options, combinatorial, inverted-combinatorial, registered and inverted-registered to send to input/output pin 217 along a line 225. The macrocell also has a product term programmable output enable 227 which can select pin 217 for either output or input.

There is only one available feedback line 229 back into programmable AND array 231. A feedback select 233 having switching elements F1–F3 can select the feedback of either the combinatorial state via conductor 235 and switch F1, the register output Q via conductor 237 and switch F2, or the pin input or output via line 239 and switch F3. This limits the user as follows. If pin 217 is selected for input by output enable 227, the input signal follows lines 239 and 229 to AND array 231, thereby precluding the use of the combinatorial output on sum line 213 or the registered outputs Q and $\overline{Q}$ from flip-flop 219. Even when pin 217 is selected for output, only one of the signals can be fed back into the array 231. The other signal, combinatorial or registered, is not available to the array. This can result in up to half of the chip's resources being sacrificed.

An object of the present invention is to provide programmable logic devices with more flexible output macrocells to permit increased use of the available gates while retaining the high performance of simpler devices.

DISCLOSURE OF THE INVENTION

The above object has been met with a programmable logic device (PLD) having macrocells which include two or more flip-flop registers, including dedicated feedback lines for each of the flip-flops and for the input/output pins associated with each macrocell. Each of the macrocells also includes a plurality of OR gates with means for selectively grouping sum lines output from these OR gates together into a single sum term. These components work together to increase the use of each gate and allow the user to consume a minimum amount of logic for each function.

With a programmable output enable and separate array inputs from the I/O pins and flip-flops, a pin can be used as an input without sacrificing the product terms or flip-flops. With the output disabled, the I/O pin can be used to read data into the AND array, even with the flip-flops buried. When the output is configured as combinatorial, the registered data from the flip-flop is still available to the array. With the addition of a product term programmable clock, the input to each flip-flop can be sampled independently of the other flip-flops. Multiple flip-flops and sum lines for each macrocell with the ability to combine these terms from two or more sum lines into a single flip-flop input or pin output, gives added flexibility and more efficient use of product terms. Other advantages will be apparent from the description of the best mode.

BRIEF DESCRIPTION OF THE DRAWINGS

FIG. 1 is a logic diagram of an output macrocell of the prior art showing connections to the remainder of a programmable logic device.

FIG. 2 is a logic diagram of a first embodiment of a programmable logic device of the present invention.

FIG. 3 is a logic diagram of an output macrocell of the programmable logic device of FIG. 2.

FIG. 4 is a logic diagram of a second embodiment of a programmable logic device of the present invention.

FIG. 5 is a logic diagram of an output macrocell of the programmable logic device in FIG. 4.

BEST MODE OF CARRYING OUT THE INVENTION

With reference to FIG. 2, a programmable logic device includes pins 11 and 13, a programmable AND array 5 and OR gates 17. Pins 11 are input pins, typically about 12 in number, which connect to AND array 15. Both the input pin signals and their inverses are available to AND array 15. Pins 13 are capable of serving as either input pins or output pins, according to whether or not the output buffers 19 are enabled. The output enable is product term programmable so the pins 13 may be bidirectional, i.e. may be input pins at one time and output pins at another time depending on the logic values of selected inputs into AND array 15. There is one input/ output pin 13 per macrocell 21, typically about 10 in total number.

Three feedback lines 23 are provided from each macrocell 21 into the AND array 15 to ensure that the output configuration will not force the user to throw away flip-flops or pin outputs. AND array 15 is typically about 84 input lines wide by 171 product term lines long for the 22 pin example shown in FIG. 2. The size of the AND array will vary according to the number of input and input/output pins used, as well as the number of feedback lines 23, control lines 25 and OR gates 17 assigned to each macrocell 21 and the number of macrocells. Thus, the 84 input lines are from the twelve input pins 11, together with inverted signals from these pins, and the three feedback lines for each of the ten macrocells, including the feedback line for the input/output pins 13, together with their inverted signals.

The 171 product term lines in the example device shown in FIG. 2 are assigned to both OR gates 17 and control lines 25 leading into macrocells 21. Here, 120 product term lines are assigned in a variable format to the twenty OR gates 17, with between four and eight product term lines per OR gate, and two OR gates per each of the ten macrocells 21. The remaining 51 product term lines are assigned to the product term programmable control lines, including four lines for each macrocell 21, one line for each output buffer 19 and one line for a global preset capability. Again, the actual number of product term lines may vary from the example given here.

With reference to FIG. 3, an output macrocell 21 is provided with a plurality of flip-flop registers 27. Two flip-flops 27a and 27b are shown in FIG. 3. However, the number of flip-flops may be different in other embodiments or vary from macrocell to macrocell in a single embodiment. Each flip-flop 27a and 27b has inputs for product term programmable clock lines CK0 and CK1, product term programmable asynchronous reset lines AR0 and AR1, and a product term programmable global synchronous preset line SP. First flip-flop 27a has a data input D connected to receive signals from the sum line 29 from NOR gate 17a corresponding to a first group of product term lines 31. Second flip-flop 27b also has a data input D connected to receive data signals from the sum line 33 from NOR gate 17b corresponding to a second group of product term lines 35. First flip-flop 27a may also receive combined data signals from both sum line 29 and sum line 33 corresponding to the sum of product terms from both the first and second groups of product term lines 31 and 35, as will be explained in greater detail below. Flip-flops 27a and 27b output stored or registered data from output terminals Q0, $\overline{Q0}$, Q1, and $\overline{Q1}$. This data may be fed back to the AND array 15 along feedback lines 23a and 23b connected to respective flip-flop output terminals $\overline{Q1}$ and $\overline{Q0}$.

Both the registered output $\overline{Q0}$ from first flip-flop 27a and the combinatorial output on sum line 39 are fed into a circuit 37 which selects one of these two outputs. The output of selection circuit 37 is connected to the input of another circuit 41 that chooses whether the output to pin 13 will be active high or active low.

First group of product term lines 31, which typically are four to eight in number, drive NOR gate 17a, producing an output signal on sum line 29 which is inverted from what an OR gate would produce. Normally some form of amplification is required between sum line 29 and the output. In this apparatus, a "wire NOR" comprising a NOR gate 43 driving a transmission gate 45 coupled to a pull-up device 47 provides the necessary amplification. When the signal on sum line 29 is low, transmission gate 45 is conductive. The pull-up device 47 is then overpowered by the low sum line signal and the state at node E is low. When the signal on sum line 29 goes high, the output of NOR gate 43 goes low, turning off transmission gate 45. This is a dynamic process, and the state at node E will rise approximately halfway as the state of gate 45 is changed. After gate 45 is off, pull-up device 47 will continue to pull node E high, and the high value is propagated to flip-flop register 27a and selection circuit 37. The input signal to flip-flop 27a is inverted by the flip-flop so that a logic OR of product term lines 31 is effectively input into flip-flop 27a.

Second group of product term lines 35, also typically four to eight in number, drive NOR gate 17b, producing an output signal on sum line 33. This signal is also inverted as it is input into flip-flop register 27b so that a logic OR of product term lines 35 is effectively input.

To enable the OR'ing of the two groups of product term lines 31 and 35 to the wire NOR node E, the line C1 input to NOR gate 49 is held low. Note that when line C1 is high, the output from NOR gate 49 is always low, regardless of the signal value on sum line 33, and transmission gate 51 is always off, keeping the sum term lines 29 and 33 separate. When however line C1 is low, the state of NOR gate 49 and transmission gate 51 depends on the value on sum line 33. When either sum line 29, sum line 33 or both are low, one or both of the transmission gates 51 is conductive, allowing the low signal from either or both sum lines to overpower pull-up device 47. Node E is then low. When both sum lines 29 and 33 are high, both transmission gates 45 and 51 are off, so that pull-up device 47 pulls up the signal state at node E to high. In Boolean logic, node E is the "AND" of sums 29 and 33. The statement [X AND Y], where X and Y are NOR functions, is equivalent to the NOR of X and Y's inputs, making node E a NOR of all of the product terms on both lines 31 and 35. Again the value at node E is inverted as it is input into flip-flop register 27a, so that the OR of all the product terms is effectively input.

The selection circuit 37 comprises a pair of AND gates 61 and 63 with inputs connected to the output of flip-flop register 27a and combinatorial line 39, respectively, and toggled by a signal C0 on line 55 and an inverted signal C0 through inverter 59 onto line 57. The outputs of AND gates 61 and 63 are input into a NOR gate 65 producing a selected output on line 67. When signal C0 is low, AND gate 63 is off and AND gate 61 outputs the inverted registered signal $\overline{Q0}$ on line 52 to the NOR gate 65. The resulting value on line 67 is thus registered signal Q0. When signal C0 is high, AND gate 61 is off, and AND gate 63 outputs the combinatorial NOR signal on combinatorial line 39 to NOR gate 65. The resulting output on line 67 is the OR of either the first group of product lines 31 or both groups of product lines 31 and 35.

The signal state selection circuit 41 also comprises a pair of AND gates 69 and 71 and a NOR gate 73 and works in a similar manner as selection circuit 37. When signal C2 on line 75 is high, AND gate 69 is on and AND gate 71 is off. The signal on line 67 is then inverted by NOR gate 73 and inverted again by output buffer 19. This corresponds to selecting active high. When signal C2 is low, active low is selected, the inverted signal output by inverter 77 being sent to pin 13.

With reference to FIG. 4, a second programmable logic device also comprises input pins 81, a programmable AND array 83 receiving signals from the input pins 81, a plurality of OR gates 85, each with inputs for a group of product term lines from AND array 83 and with an output sum line leading into one of a plurality of output macrocells 87. Each macrocell has an output line through a buffer 89 to an input/output pin 91. Three dedicated feedback lines 93 lead back from the input/output pin 91 and macrocell 87 to AND array 83. Product term programmable control lines 95 from AND array 83 lead to macrocells 87 and output buffers 89. As with the embodiment in FIGS. 2 and 3, the size of the AND array 83 in FIG. 4 may vary with the number of pins, control lines, OR gates, feedback lines, etc. For example, in FIG. 4, the array may be 172 input lines wide and receive inputs from 14 input pins 81, and three feedback lines 93 for each of 24 output macrocells 89, together with inverted signal lines for each. The array may also be 416 product term lines long to drive the three OR gates 85 of four product terms each, and five control lines 95 including output enable for each of the 24 output macro-cells 87, as well as 8 synchronous preset lines for groups of macrocells. Again the actual number in any particular device may vary from the example given here.

With reference to FIG. 5, the output macrocells 87 in the device in FIG. 4 receives a total of 17 product term lines 97 from the programmable AND array 83. Three groups of four product term lines 97 feed into NOR gates 85a, 85b and 85c respectively. The other five product term lines 97 are user programmable output enable OE, and clock lines CK1 and CK2, and asynchronous reset lines AR1 and AR2 for output buffer 89, and flip-flop registers 99a and 99b. Each flip-flop 99a and 99b also has a synchronous preset input SP which may also be product term programmable, with one preset line SP usually being assigned to several macrocells.

Each macrocell may be set for input or output or bidirectional throughput by user programmable output enable line OE. When buffer 89 is disabled, input signals from pin 91 are fed into the AND array via feedback line 93c and the contents of flip-flops 99a and 99b are buried and fed back into the AND array through feedback lines 93b and 93a, respectively.

When buffer 89 is enabled, the output chosen may be either registered or combinatorial depending on the value of signal C2 input to selection circuit 100, and either active low or active high depending on the value of signal C3 also input into selection circuit 100. When signal C2 is low, upper transmission gates 104 and 105 are both off, and one of the lower transmission gates 107 and 109 is on, thereby conducting data output from flip-flop 99a to output buffer 89. Likewise, when signal C2 is high, lower transmission gates 107 and 109 are both off, and one of the upper transmission gates 104 and 105 is on, thereby conducting the combinatorial signal from node E along combinatorial line 111 to buffer 89. The state of signal C3 determines which one of the two gates, gates 104 or 105 in the case of combinatorial output or gates 107 or 109 in the case of registered output is on. A low state for C3 corresponds to active low output and a high state for C3 corresponds to active high output.

When registered output is selected (C2=0), signals are input into flip-flop register 99a from one or more of the NOR gates 85a, 85b, and 85c via node E, lines 113 and 115 and transmission gate 117. The number of product term lines 97 combined for inputting into flip-flop 99a will depend on the value of signals C0 and C1. The wired NOR circuits work in the same manner as in FIG. 3, except that there are now three groups of product term lines that may be connected. Sum line 101 from first NOR gate 85a is always input into register 99a when set for registered output. When signal C0 input into wire NOR gate 119 is low, then second sum line 102 from second NOR gate 85b is also connected into register 99a, resulting in a sum of eight product terms. When signal $\overline{C1}$ input into wire NOR gate 121 is low, the third sum line 103 from third NOR gate 85c is also included in the summing, resulting in a sum of twelve product terms being input into register 99a. Third sum line 103 is also input into a second register 99b, which register is buried with outputs from this register being fed back into the AND array along feedback line 93a.

When combinatorial output is selected (C2=1), combinatorial signals are fed to output buffer 89 along combinatorial line 111, and register signals to buried first register 99a are fed along lines 123 and 113 through transmission gate 125. First register 99a receives data only from second sum line 102, which data is stored then fed back to the AND array via feedback line 93b. As in the registered output case, second register 99b receives data only from third sum line 103, which data is stored then fed back to the AND array via feedback line 93a. Combinatorial signals on line 111 may result from the combination of one, two or three sum lines 101, 102 and 103 depending on the values of signals C0 and C1 toggling the wire NOR circuit. Again, when signal C0 is high and signal C1 is low, only first sum line 101 forms part of the combinatorial signal. When signal C0 is low, sum lines 101 and 102 are combined to form a sum of eight product term lines. When signal C0 is low and signal C1 is high, all three sum lines 101–103 are combined to form a sum of twelve product term lines. Thus, a variable number of product term lines may be selected for combination without sacrificing the use of flip-flops 99a and 99b.

The embodiments described above are merely exemplary, and not the only possible combinations of elements. The number of OR or NOR gates assigned to each output macrocell may be two or three, as described above, or even four or more. The number of flip-flop registers may be two or more, and as long as a feedback line back into the AND array of the device is provided for each flip-flop and output pin, no flip-flop or pin need be wasted when a particular input or output combination is selected. Product term programmable clock terms, asynchronous resets and global synchronous presets are preferably assigned to each flip-flop or group of flip-flops so that the flip-flops may operate independently of one another when desired. This combination of elements in a macrocell provides maximum flexibility without sacrificing performance.

I claim:

1. An output macrocell for a programmable logic device comprising, an input/output pin connectable to an external but for transferring data into and out of the programmable logic device, an output buffer connected to said pin, a product term programmable output enable means connected to said output buffer for selectively enabling data placed in said output buffer to be output to the bus through said input/output pin, a dedicated path from said input/output pin to a programmable AND array of the programmable logic device, said dedicated path feeding data output through said input/output pin back to said array whenever said output buffer is enabled, said dedicated path inputting data from said external bus into said array whenever said output buffer is disabled by said enable means, a first flip-flop register with an input connected to a first sum term line from said array via a first OR gate and with an output in selectable data communication with said output buffer, said output also connected to a dedicated feedback path to said array, and a second flip-flop register with an input connected to a second sum term line from said array via a second OR gate and with an output connected to a feedback path to said array, said second sum term line being selectively connectable to an input of said first OR gate producing said first sum term line.

2. The macrocell of claim 1 further comprising a product term programmable clock line connected to a clock input of said flip-flop register.

3. The macrocell of claim 1 further comprising means for selecting between combinatorial and registered output, said selecting means having an input connected to both said first flip-flop register's output and said sum term line and having an output connected to said output buffer.

4. The macrocell of claim 1 wherein each of said first and second OR gates comprises,
   a first NOR gate with inputs connected to a plurality of product term lines from said programmable AND array and with a sum term line as an output therefrom,
   a second NOR gate with one input connected to said sum term line, with a second input and with an output,
   a pass transistor with a gate connected to said output of said second NOR gate, with a source connected to said sum term line output from said first NOR gate, and with a drain,
   wherein said first and second OR gates are selectively connectable by means of said drains of said respective pass transistors being connected to a common node, a pull-up transistor also being connected to said node, and respective second inputs of said corresponding second NOR gates being at ground for said first OR gate and being selectively at ground or high for said second OR gate,
   said input of said first flip-flop register connected to said node.

5. A programmable logic device comprising,
   a programmable AND array having product term lines as outputs,
   a plurality of pins with connecting paths into said programmable AND array, at least one of said pins being an input/output pin connected to an output buffer, a product term line connecting to said output buffer so as to form a programmable output enable for said output buffer, and
   at least one output macrocell, each macrocell associated with one input/output pin, each macrocell including a plurality of OR gates, each OR gate having as inputs a fixed group of said product term lines from said AND array, each OR gate having as an output a sum term line, each macrocell also including a plurality of flip-flop registers, each of said registers having an input connected to a sum term line and an output connected to a dedicated feedback line back to said programmable AND array, at least one of said flip-flop registers in said macrocell having an output which is also in selectable communication with said associated input/output pin.

6. The programmable logic device of claim 5 wherein sum term lines output from OR gates in the same macrocell are switchably connectable together into a single sum line.

7. The programmable logic device of claim 6 wherein each of said OR gates in said macrocell comprises,
   a first NOR gate with inputs connected to a group of said product term lines and with a sum term line as an output therefrom,
   a second NOR gate with one input connected to said sum term line, with a second input and with an output,
   a pass transistor with a gate connected to said output of said second NOR gate, with a source connected to said sum term line from said first NOR gate, and with a drain, said drain connected to a node, and
   a pull-up transistor connected to said node, wherein said node is common to at least one of said pass transistor drain corresponding to at least one of said OR gates, said second inputs of said second NOR gate corresponding to one of said OR gates being at ground, said inputs of said second NOR gates corresponding to others of said OR gates being selectively at ground or high.

8. The programmable logic device of claim 5 wherein each flip-flop register has a clock input connected to a product term line so as to form a programmable clock line for said flip-flop register.

9. The programmable logic device of claim 5 wherein each flip-flop register has a reset input connected to a product term line.

10. The programmable logic device of claim 5 wherein each group of at least one flip-flop register has a preset input connected to a product term line.

11. The programmable logic device of claim 5 wherein said macrocell further includes means for selecting a connection to said associated input/output pin from either of said flip-flop registers or an OR gate output.

12. A programmable logic device comprising,
   a plurality of pins, at least one of said pins being an input/output pin,
   a programmable AND array having input lines connected to said pins and having product term lines as outputs from said AND array,
   first and second OR gates, said first OR gate having a first group of said product term lines as inputs to said first OR gate and having a first sum line as an output from said first OR gate, said second OR gate having a second group of said product term lines as inputs to said second OR gate and having a second sum line as an output from said second OR gate, means for selectively combining said second sum line with said first sum line, first and second registers, said first register having a data input connected to said first sum line and having a first register output, said second register having a data input connected to said second sum line and having a second register output, each register having a clock input connected to one of said product term lines, an output buffer having an output connected to said input/output pin, said buffer having an enabling input connected to one of said product term lines, means having inputs connected to said first sum line and said first register output for selecting one of said inputs and outputting said selected input to said buffer, an input to said buffer connected to an output from said selecting means, and feedback lines connected to each of said first and second register outputs and said input/output pin, said feedback lines connected as inputs into said AND array.

13. The programmable logic device of claim 12 wherein said selectively combining means comprises, a first NOR gate with one input connected to said first sum line, with a second input and with an output, said second input being at ground, a first pass transistor with a gate connected to said output of said first NOR gate, with a source connected to said first sum line, and with a drain connected to a node, a second NOR gate with one input connected to said second sum line, with a second input and with an output, said second input being selectively at ground or high, a second pass transistor with a gate connected to said output of said second NOR gate, with a source connected to said second sum line, and with a drain connected to said node, and a pull-up transistor connected to said node, said data input of said first register connected to said node.

14. The programmable logic device of claim 13 further comprising, a third OR gate having a third group of said product term lines as inputs thereto and having a third sum line as an output therefrom, and means for selectively combining said third sum line with said first sum line.

15. The programmable logic device of claim 14 wherein said means for selectively combining said second and third sum lines with said first sum line comprises, a first NOR gate with one input connected to said first sum line, with a second input and with an output, said second input being at ground, a first pass transistor with a gate connected to said output of said first NOR gate, with a source connected to said first sum line, and with a drain connected to a node, a second NOR gate with one input connected to said second sum line, with a second input and with an output, said second input being selectively at ground or high, a second pass transistor with a gate connected to said output of said second NOR gate, with a source connected to said second sum line, and with a drain connected to said node, a third NOR gate with one input connected to said third sum line, with a second input and with an output, said second input being selectively at ground or high, a third pass transistor with a gate connected to said output of said third NOR gate, with a source connected to said third sum line, and with a drain connected to said node, and a pull-up transistor connected to said node, said data input of said first register connected to said node.

* * * * *

UNITED STATES PATENT AND TRADEMARK OFFICE
CERTIFICATE OF CORRECTION

PATENT NO. : 4,894,563

DATED : January 16, 1990

INVENTOR(S) : Keith H. Gudger

It is certified that error appears in the above-identified patent and that said Letters Patent is hereby corrected as shown below:

Column 2, line 63, "array 5" should read - - array 15 - -.

Claim 1, column 7, line 1, "but" should read - - bus - -.

Claim 7, column 8, line 36, "OR" should read - - OR - -.

Claim 14, column 10, line 3, "claim 13" should read
 - - claim 12 - -.

Signed and Sealed this

Twelfth Day of March, 1991

Attest:

HARRY F. MANBECK, JR.

*Attesting Officer*   *Commissioner of Patents and Trademarks*